United States Patent [19]

Usagawa et al.

[11] Patent Number: 5,233,205
[45] Date of Patent: Aug. 3, 1993

[54] QUANTUM WAVE CIRCUIT

[75] Inventors: Toshiyuki Usagawa, Yono; Shirun Ho, Kokubunji; Ken Yamaguchi, Fuchu; Yoshiaki Takemura, Kawasaki, all of Japan

[73] Assignee: Hitachi, Ltd., Tokyo, Japan

[21] Appl. No.: 902,554

[22] Filed: Jun. 22, 1992

Related U.S. Application Data

[63] Continuation of Ser. No. 588,072, Sep. 25, 1990, abandoned.

[30] Foreign Application Priority Data

Sep. 25, 1989 [JP] Japan .................... 1-246283

[51] Int. Cl.$^5$ .............. H01L 29/161; H01L 27/12; H01L 45/00
[52] U.S. Cl. ............................ 257/23; 257/24; 257/25; 257/192; 257/194; 307/440; 307/445; 307/448; 307/450
[58] Field of Search ........... 357/16, 4, 22 A, 22 MD; 307/440, 445, 448, 450; 257/14, 23, 24, 25, 192, 194

[56] References Cited

U.S. PATENT DOCUMENTS

| | | | |
|---|---|---|---|
| 4,912,531 | 3/1990 | Reed et al. | 357/16 |
| 4,942,437 | 7/1990 | Fowler et al. | 357/16 |
| 4,969,018 | 11/1990 | Reed | 357/16 |

FOREIGN PATENT DOCUMENTS

89/07832  8/1989  PCT Int'l Appl. .......... 357/16

OTHER PUBLICATIONS

Reed, "The Quantum Transistor", pp. 275 to 281, May 1989, BYTE magazine.

Datta, et al., *Proposed Structure for Large Quantum Interference Effects*, Applied Physics Letter 48, Feb. 17, 1986, pp. 487–489.

Usagawa, *Quantum Interference Effect on Low–Energy He Atomic Beam Scattering at the Surface of He II*, Physics Letters, vol. 73A, No. 4, Oct. 1, 1979, pp. 339–342.

*Primary Examiner*—Andrew J. James
*Assistant Examiner*—Ngan Van Ngo
*Attorney, Agent, or Firm*—Kenyon & Kenyon

[57] ABSTRACT

A novel concept and structure of a semiconductor circuit are disclosed which utilize the fact that the interaction between the carriers such as electrons and holes supplied in a meso-scopic region and the potential field formed in the meso-scopic region leads to such effects as quantum interference and resonance, with the result that the output intensity is changed.

13 Claims, 9 Drawing Sheets

$Y = X_1 \cdot X_2$ $Y = X_1 \cdot X_2 \cdot X_3$

F I G. 2A
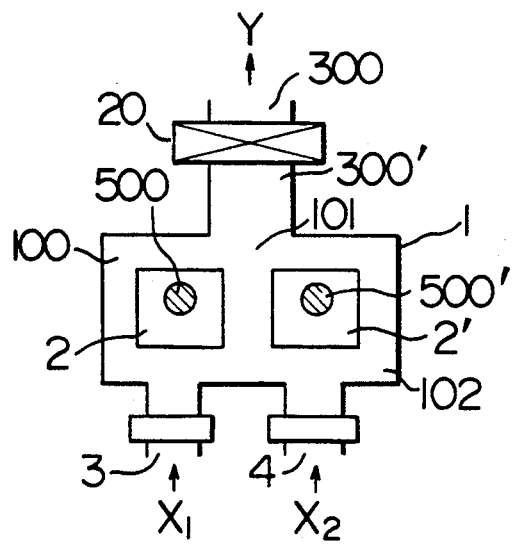
F I G. 2B
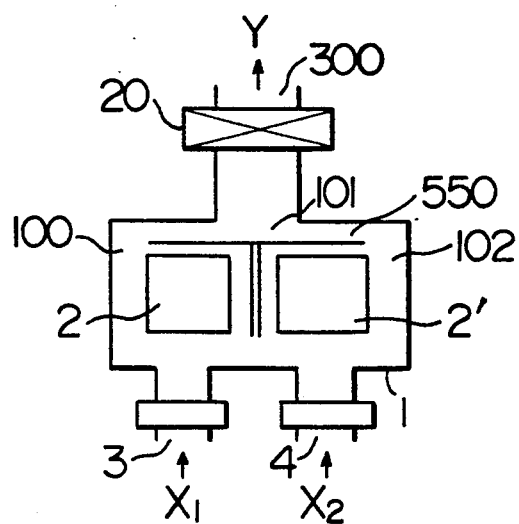
F I G. 2C
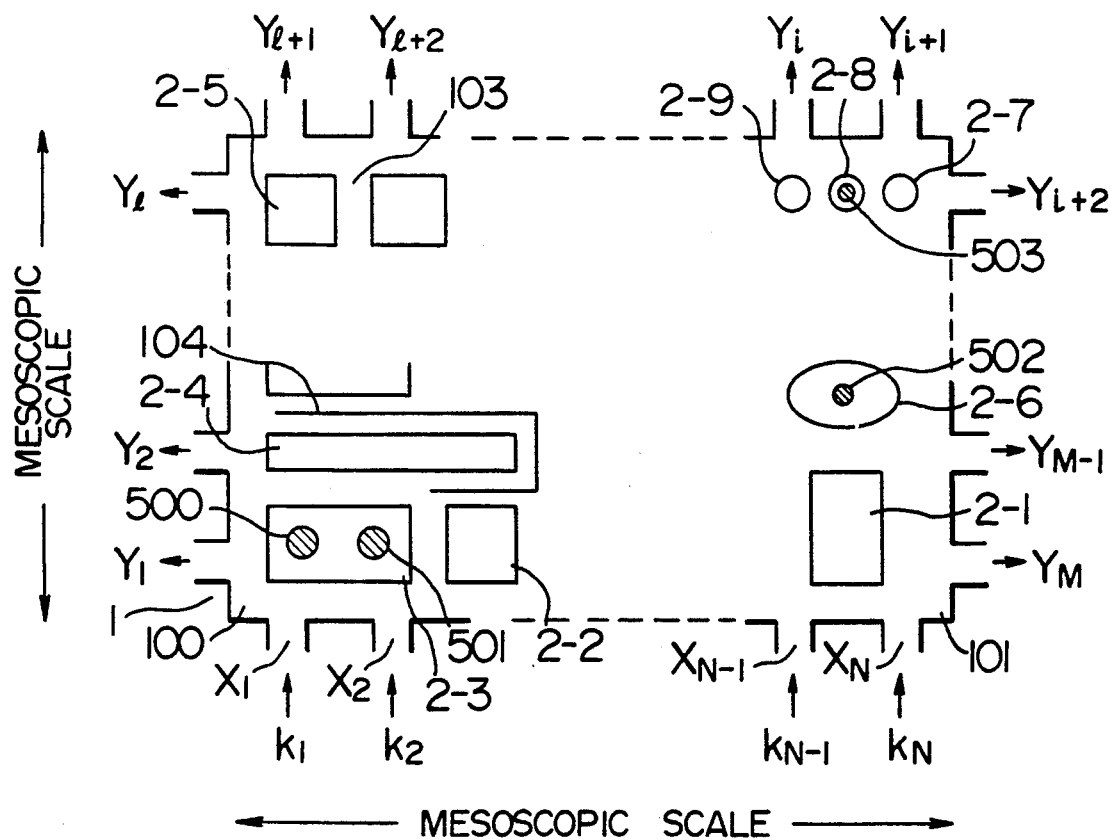

$Y_1 = |\Psi_1|^2$
$Y_2 = |\Psi_2|^2$ $Y_{12} = |\Psi + \Psi_2|^2$

FIG. 8

| | PRIOR ART LSI | PRESENT INVENTION LSI |
|---|---|---|
| ARCHITECTURE | INTEGRATION OF ELECTRON CIRCUIT | INTEGRATION OF QUANTUM WAVE CIRCUIT |
| STRUCTURE | CHIP, ~$\mu$m × ~$\mu$m MEMORY CELL, WIRING, ~1 cm | CHIP, ~1$\mu$m × ~1$\mu$m MESOSCOPIC QUANTUM WAVE CIRCUIT, WIRING |
| INTEGRATION DENSITY | 64 MDRAM | 1 T BIT RAM |
| MINIMUM CHARACTERISTIC LENGTH | 0.3 $\mu$m | 0.01 $\mu$m |
| ELEMENT NUMBER | ~$10^8$ | ~$10^{12}$ |
| BASIC CIRCUIT | ELECTRON CIRCUIT | QUANTUM WAVE CIRCUIT {MEMORY, LOGIC} |
| FEATURE | INTEGRATION OF SEMICONDUCTOR DEVICES | INTEGRATION OF QUANTUM WAVE CIRCUIT UNITS WHICH UTILIZE QUANTUM INTERFERENCE |

QUANTUM WAVE CIRCUIT

This application is a continuation of application Ser. No. 07/588,072, filed on Sep. 25, 1990 now abandoned.

BACKGROUND OF THE INVENTION

1. Field of the Invention

The present invention relates to a semiconductor circuit for executing a logic operation by a quite novel mechanism, or more particularly to a quantum wave circuit suitably used with an ultra-high density logic operation circuit operating at a very high speed with a low power consumption utilizing the quantum wave interference effect of the carriers including electrons and holes.

2. Description of the Related Art

Since the invention of a semiconductor integrated circuit initiated by the planer technique of J. Kilby of Texas Instruments and R. Noyce, et al. of Fairchild in 1959, the progress of the Si or GaAs LSI (Large Scale Integration) technique has been very conspicuous. (See, for example, 1. Ultrahigh speed bipolar device, 2. Ultrahigh speed MOS device, and 3. Ultrahigh speed chemical compound semiconductor device, in Ultrahigh Speed Digital Device Series, edited by Takuo Sugano and published by Baifukan 1985-1988.)

The architecture involved has consistently been unit devices (such as a bipolar transistor, MOSFET, resistor and capacitor), formed on the same substrate, isolated and wired thereby to constitute a system (large scale integrated circuit; LSI) on Si or GaAs. This conventional architecture has been intended to improve the device performance by reducing the size of devices and thus the performance as an LSI. Note however, in the case of an Si MOS memory of 64 megabit DRAM, while the memory cell size has been reduced to as small as 1 $\mu m^2$, further integration is considered not industrially advantageous mainly due to the difficulty in wiring (as the unit price per bit and the operating speed fail to improve). In other words, the very technical concept of improving the integration degree by reducing the device size is losing its effectiveness. The high integration by an Si bipolar ECL (Emitter Coupled Logic) circuit, on the other hand, is seriously hampered by the problem of heat generation, let alone reduction in size.

Specifically, the conventional architecture of highly integrated semiconductor devices is being technically saturated or facing a limit with respect to
1) High integration
2) Operating speed of LSI, and
3) Power consumption.

S. Datta, et al. have recently suggested in Appl. Phys. Lett. 48 (1986) 487 a field effect transistor QUIT (Quantum Interference Transistor) for controlling the source-drain current by utilizing the interference effect derived from the "route difference" of electrons. This suggestion is aimed only at high performance of a unit device (a FET of very low power consumption) and relates to a semiconductor device included in the category of the conventional architecture referred to above.

In the prior art, Mark A. Lead and Robert T. Bate have used electrons trapped in a quantum box called the quantum dots as a memory or developed a quantum well logic connecting quantum boxes by the tunneling effect (JP-A-61-82470, JP-A-61-82471, JP-A-61-82472, JP-A-61-82473). Although control terminal is required in order to form a potential gradient or the like in the electron tunnel between quantum boxes and the mere arrangement of quantum boxes still lacks the function as a circuit or a system, these devices are practically distinguishable from the conventional architecture of a semiconductor integrated circuit.

SUMMARY OF THE INVENTION

Accordingly, the object of the present invention is to provide a novel architecture breaking through the limits of the above-mentioned conventional architectures of a semiconductor integrated circuit, that is, the architecture of integrating semiconductor devices, and by thus parting with the conventional architecture of integrating devices, to realize a semiconductor circuit capable of constituting a logic circuit or a semiconductor memory higher in the degree of integration three or four orders of magnitude higher than the conventional memory of 1G (giga)-bit class which has so far been the limit of LSI capacity.

According to one aspect of the present invention, there is provided a quantum wave circuit comprising an input gate supplied with carriers making up a signal, an output gate for producing the carriers, and a guide including a plurality of paths for leading the carriers from the input gate to the output gate, wherein those paths where the carriers pass are selected by the probability of the interaction between the quantum wave of the carriers and the potential of the guide. Electrons or holes may be used as the carriers. Ideally, the operation is executable by a quantum wave circuit according to the present invention in the presence of a single carrier. It is, however, possible to improve the accuracy of the operation by using a plurality of carriers. If there exists a plurality of output gates for each input, the execution of operation may be checked by comparing the number of carriers produced at respective output gates, that is to say, by comparing the carrier intensities.

FIG. 8 shows a simple comparison between the architecture supporting a conventional LSI and the architecture of the present invention. The greatest feature of the conventional LSI lies in the integration of semiconductor devices as well known. A system is constituted by connecting units of an electron device (such as a memory cell and logic units including NAND and OR) having semiconductor devices by wirings. A typical memory cell measures approximately 1 $\mu m^2$ while a typical memory chip measures approximately 1 cm$^2$ respectively. In the configuration of a quantum wave circuit or an LSI using the same circuit according to the present invention (in the right column of FIG. 8), a quantum wave circuit having a memory or logic function and utilizing the interference effect representing the wave characteristics indicated by electrons (or such carriers as holes) is integrally formed as a chip in a meso-scopic size within a region of about 1 $\mu m \times 1$ $\mu m$ (in such a size that electrons and holes are subjected to elastic scattering but not to inelastic scattering, that is, in a region where the behavior of carriers including electrons and holes is controlled principally by the elastic scattering) by application of the conventional wiring technique. The "quantum wave" means a wave function describing carriers including but not limited to electrons and holes. In this way, it is possible to integrate ultrahigh-speed, low-power consumption integrated memories or logic circuits of 1K to 16K bits in a meso-scopic region up to the degree of integration of about 1G bits within a chip of 1 cm$^2$. Also, a quantum wave circuit LSI very high in speed and very low in power consumption may generally be formed with an ultrahigh integration degree of 1T to 16T bits.

Specifically, as compared with the prior art in which an electronic circuit is configured by integrating semiconductor devices to form a system like a largescale memory, the present invention has a feature in that circuits or units having a system function are configured by use of the interference effect of electrons (or holes) in a meso-scopic size. The integration of these units makes it possible to form a system of very high integration.

According to one aspect of the present invention, a quantum wave circuit using the three-dimensional interference or resonance effect of a quantum wave is provided.

According to another aspect of the present invention, a quantum wave circuit comprising means for forming a three-dimensional potential well of a material having a different electron affinity is provided. For instance, in a meso-scopic size (in such a size as permits elastic scattering but not inelastic scattering of electrons or holes), means for forming a potential barrier (hetero-junction barrier) using a material different from the base material with a plurality of paths of electrons or the like in the well, and means with the potential barrier of a shape potential in a stereoscopic three-dimensional potential arranged to have a desired circuit, that is, memory or logic function, in which the output is controllable against a plurality of input quantum waves by use of the wave effect such as interference or resonance of the quantum waves in the three-dimensional potential well.

According to a limited aspect of the present invention, a quantum wave circuit in which impurities are intentionally arranged within the potential barrier is provided. This allows the interference of electrons or the like in the stereoscopic three-dimensional well thereby controlling and designing an interference pattern of electrons.

According to another limited aspect of the present invention, a quantum wave circuit in which a metal of about 0.5 to 10 nm is deposited on a part of the side wall of the stereoscopic three-dimensional potential well is provided thereby controlling and designing the potential distribution in the three-dimensional potential.

The quantum wave input is introduced by way of an input gate connected with the path which may be called a quantum (carrier) wave guide. The quantum wave output is led out by way of an output gate connected to the quantum wave guide. The sensing function may be incorporated in the process, if required.

According to still another limited aspect of the invention, a quantum wave circuit in which a band structure induced by what is called a two-dimensional electron (hole) gas is formed as a path (quantum wave guide) for passing the carriers thereby to remarkably improve the propagation speed of carriers is provided and increasing the interference distance of the quantum wave of the carriers at the same time.

According to still another limited aspect of the present invention, a quantum wave circuit wherein a plurality of units each making up a configuration from the input to output gates are prepared and an output gate of a given unit is connected to an input gate of another unit is provided thereby connecting a plurality of units.

According to a further limited aspect of the present invention, a quantum wave circuit wherein the path (quantum wave guide) has a closed circuit allowing the self-interference of the quantum wave of carriers therein is provided.

Accordingly, the present invention further has the features mentioned below.

Specifically, according to one aspect of the present invention, a quantum wave circuit comprising an input section supplied with carriers, an output section for producing the carriers, and a carrier route arranged between the input section and the output section for determining the quantum mechanical probability of producing at the output section the carriers supplied with the input section is provided, wherein the carrier route is formed in such a scale that the behavior of the carriers is controlled mainly by elastic scattering.

According to a limited aspect of the present invention, there is provided a quantum wave circuit wherein the carrier route has a plurality of paths.

According to another limited aspect of the present invention, a quantum wave circuit wherein the carrier route includes a plurality of paths connecting the input and output sections is provided. This configuration realizes a closed circuit between the input and output sections and thus a quantum wave circuit using the self-interference effect of carriers. The above-mentioned carrier route is formed by a region surrounded by a potential barrier. The path is configured, on the other hand, similarly by forming a potential barrier in the carrier route. A preferable potential barrier is formed by various hetero-junctions of a chemical compound semiconductor. The carrier route may include a field application means such as a metal electrode in order to change the quantum mechanical probability.

An advantage of the present invention resides in the semiconductor circuit configuration which is realized with a very high integrity.

Another advantage of the present invention is that a semiconductor circuit is realized which is capable of executing a logic operation at high speed.

Still further advantages of the present invention will become apparent to those of ordinary skill in the art upon reading and understanding the following detailed description of the preferred embodiments.

BRIEF DESCRIPTION OF THE DRAWINGS

The invention may take various forms in various parts and various arrangements of parts. The drawings are only for the purpose of illustrating the preferred embodiments and not to be construed as limiting the invention.

FIGS. 2A through 2C are plain views for explaining other embodiments of a quantum wave circuit according to the present invention.

FIG. 8 is a diagram for explaining the difference between a quantum wave circuit according to the present invention and a conventional circuit.

DETAILED DESCRIPTION

Figure 1A:
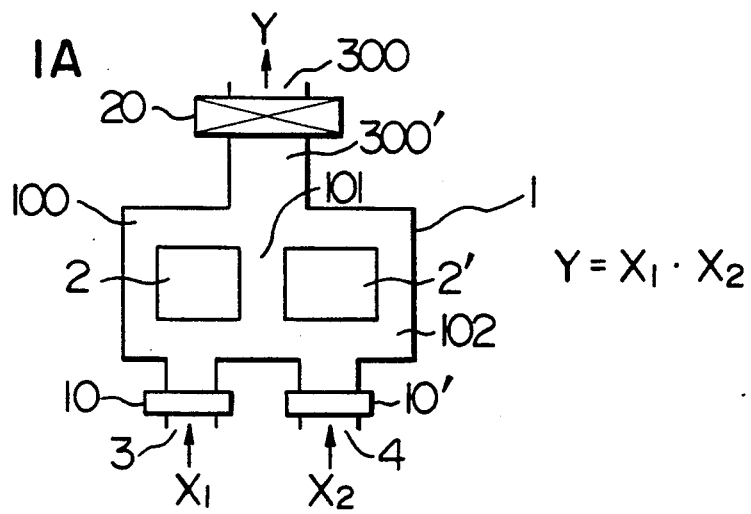
FIGS. 1A through 1G are plan views for explaining embodiments of a quantum wave circuit according to the present invention.

A quantum wave circuit according to the present invention will be explained below with reference to the accompanying drawings. The reference numerals identical in the drawings designate corresponding component elements respectively.

As is well known, a given digital circuit may be constituted by an inverter circuit, an AND circuit, an OR circuit, a NOR circuit and a NAND circuit. Explanation will be made about the manner in which these basic circuits are formed of a quantum wave circuit according to the present invention.

An AND circuit will be described with reference to FIG. 1A. Electrons making up carriers are introduced into a potential well through input gates 10, 10' with electron wave guides 3, 4 as an input in a stereoscopic three-dimensional region surrounded by a potential barrier ($Al_xGa_{1-x}As$; x=0.65, etc.) 1. The electrons thus introduced are passed through electron wave paths (carrier route; GaAs or the like) 100, 101, 102 partitioned by the potential barriers 2, 2' ($Al_xGa_{1-x}As$; x=0.65 or the like) and 1, and proceed toward an output electron wave guide 300 through a sensing output gate 20, if necessary, from an output window 300' (GaAs or the like). FIG. 1A is a sectional plan view of this AND circuit. A specific shape of this circuit will be described in detail with reference to an embodiment later. The conditions of the electrons entering the input gates will also be explained in detail later with reference to FIGS. 4A to 4C and 5A to 5C. Input electron beams, even though they may have various initial degrees of energy of input electrons, are capable of being selectively applied with a uniform energy to the input gates by appropriately selecting the energy or wave number through a filter or the like or properly designing the input wave guides 3, 4.

There are two ways of designing the AND circuit. The first method will be explained at first. By appropriately designing the arrangement, size, shape and height of the potential barriers 2, 2' or the stereoscopic three-dimensional region surrounded by the potential barrier 1, it is possible to produce the electron waves synchronized and intensified with each other from the output window 300' only in the case where the input electron waves $X_1, X_2$ are synchronized with each other. The potential barriers 2, 2' are designed in such a way that when only one of the input electron waves $X_1, X_2$ is applied as an input, the electron waves are produced at the output window 300' offsetting and out of phase with each other by $\pi$ through the potential barriers 2, 2'. No output electron wave is produced in the absence of the input electron waves $X_1, X_2$. In this way, the presence of input is assumed to be "1", the absence of input to be "0", the output intensity exceeding a predetermined value (threshold) to be "1" and the output intensity failing to exceed a predetermined value to be "0". Then, FIG. 1A constitutes an AND circuit. Specifically, the output "1" is produced only in response to the two inputs of $X_1$ and $X_2$. As will be seen from this, an electron wave logic is realized by the interference effect utilizing the "route difference" of electrons in a stereoscopic three-dimensional region surrounded by the potential barrier 1. In this method, the output becomes "1" only when the input electron waves $X_1, X_2$ are applied in phase. As a result, the input gates 10, 10' are required to incorporate a device described below.

Now, a second method will be explained. By appropriately designing the arrangement, size, shape and height of the potential barriers 2, 2' and the stereoscopic three-dimensional region surrounded by the potential barrier 1, it is possible to make sure that in response to only one of the input electron waves $X_1, X_2$ applied, the electron waves appearing in the output window 300' are out of phase by $\pi$ offsetting each other by the potential barriers 2, 2'. Specifically, the output electron wave is capable of being reduced to "0". In the case where the input electron waves $X_1, X_2$ are both applied as input, on the other hand, it is possible to assure that the electron waves appearing in the output window 300' are in phase and intensify each other by appropriately designing the arrangement, size, shape and height of the potential barriers 2, 2' and the stereoscopic three-dimensional region defined by the potential barrier 1. Specifically, the output electron wave may be set to "1". In the absence of the electron waves $X_1, X_2$, the output electron wave of course disappears. In this way, in accordance with the presence or absence of the input electron waves $X_1, X_2$, the arrangement, size, shape and height of the potential barriers 2, 2' and the stereoscopic three-dimensional region surrounded by the potential barrier 1 are designed to attach the logic-product function of "0" and "1" to the output electron wave. Specifically, only in response to the application of two inputs of $X_1, X_2$, the output "1" is produced. An electron wave logic is thus realizable by the interference effect taking advantage of the "route difference" of electrons in the stereoscopic three-dimensional region surrounded by the potential barrier 1. What requires attention here is that the first and second methods have different specific values of the arrangement, size, shape and height of the potential barriers 2, 2' and the stereoscopic three-dimensional region surrounded by the potential barrier 1.

Especially, the second method is based on the principle of the electron beam holography (See, for example, "Electron Beam Holography and Aharonov-Bohm Effect" by Akira Sotomura, Chapter 7, Quantum Mechanics and New Techniques, Edited by The Physical Society of Japan, 1987).

The interference effect based on the concept of "coherency of location" will be explained with reference to FIGS. 3A to 3G. First, reference is had to FIGS. 3A and 3B to describe the "coherency of location" in the interference effect of electron beams. A point electron beam source 600, a diffraction grating 601 and an electron detector 607 are prepared. An electron emitted from the electron beam source 600 reaches a specific place 604 of the electron detector 607 through a specific route 603 with a certain probability. A multitude of electrons emitted from the electron beam source 600 at random are distributed in the manner indicated by 602 on the electron detector 607 with a certain probability. This distribution pattern is the same as if an electron wave is emitted from the point electron beam source 600, according to the teachings of the quantum mechanics. In spite of random emission of electrons, this coincidence of patterns is essentially attributable to the fact that the electron beam source is at a point. This fact is called "the coherency of location".

Assume that two point electron beam sources 605, 606 are apart from each other by a length of L, for example. If each of the electron beam sources forms a point and the distance L between them is fixed, the above-mentioned "coherency of location" causes a diffractive pattern to be formed on the electron detector in the same manner as if an electron wave is emitted from an electron beam source. This is also the case when there are a plurality of electron beam sources. In an ordinary electron beam apparatus, however, the distance L between beam sources cannot be fixed or the distance LL between the diffraction grating and the electron beam sources is large as compared with the distance between the beam sources, and therefore the interference effect of the "coherency of location" observed in the presence of a plurality of beam sources has not yet experimentally be demonstrated.

Figure 3A:
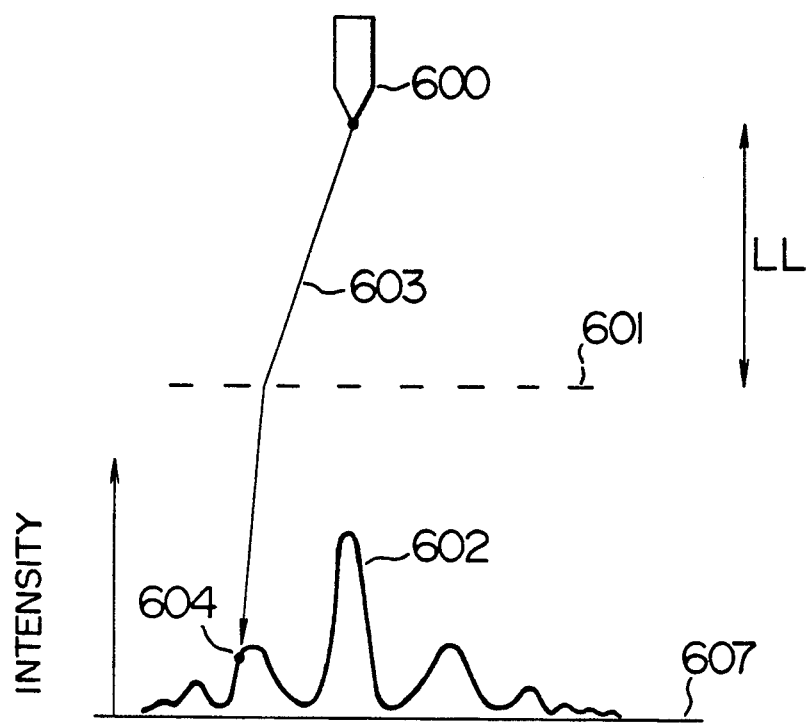
FIGS. 3A through 3E are schematic diagrams for explaining the operation of a quantum wave circuit according to the present invention.
Figure 3B:
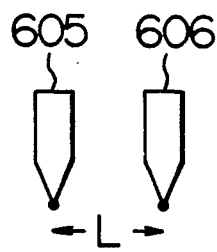
Figure 3C:
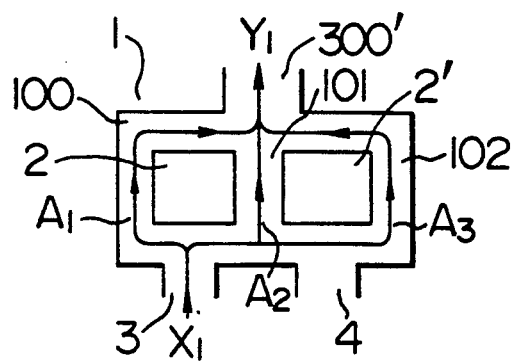
Figure 3D:
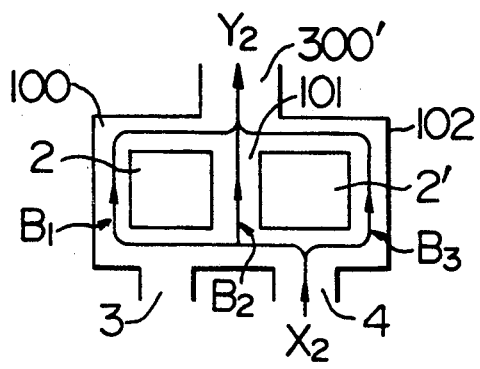

An electron wave circuit of meso-scopic size, on the other hand, realizes the interference effect of "the coherency of location" very easily in the presence of a plurality of electron beam sources. This fact realized with the AND circuit shown in FIG. 1A will be explained with reference to FIGS. 3C to 3G. The electron wave $X_1$ applied from an input gate 3 on the left side proceeds as an output signal $Y_1$ through three paths $A_1$, $A_2$, $A_3$ toward an output gate 300′ (FIG. 3C). In this case, a specific electron proceeds to the output gate 300′ through one of the three paths $A_1$, $A_2$, $A_3$ with a predetermined probability. In this case, the input gates 3, 4 correspond to electron beam sources. Electrons enter the input gate 3 at random. The output signal $Y^2$ at the output gate, however, is expressed by the square of the wave function $\Psi_2$ at the output gate position 300′ as an interference pattern of the three paths $B_1$, $B_2$, $B_3$ of the electron wave (FIG. 3D).

Figure 3E:
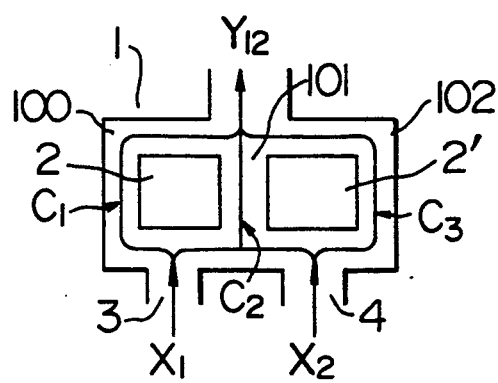
Figure 3F:
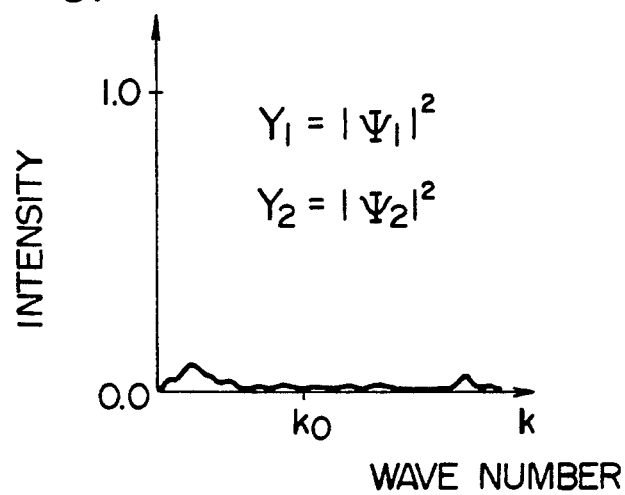
FIGS. 3F and 3G are diagrams for explaining the output intensity of an output gate of a quantum wave circuit according to the present invention.
Figure 3G:
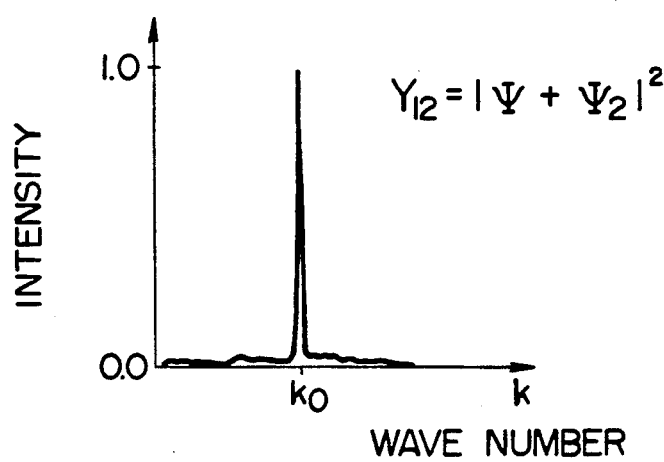

When electrons enter the input gates 3, 4, the output signal $Y_{12}$ at the output gate is expressed by the absolute value of the wave function $\Psi_3$ at the output gate position 300′ as an interference pattern of the three paths $C_1$, $C_2$, $C_3$ of electron waves. Due to the "coherency of location", on the other hand, the wave function $\Psi_3$ is expressed as the sum of the wave function $\Psi_1$ and the wave function $\Psi_2$. As a result, the interference effect due to the phase difference between the two wave function $\Psi_1$ and $\Psi_2$ appears (FIG. 3E). For example, unlike in the case of FIG. 3F in which the output signal Yi (i=1, 2) corresponding to the momentum k has a very small value for a specific momentum $k_0$, the electron wave circuit can be designed such that output signal $Y_{12}$ has a very large value due to the interference effect in the case where electrons enter the input gates 3, 4 as shown in FIG. 3G.

According to this principle, an electron wave logic using the interference effect due to the "coherency of location" is realized.

Figure 1B:
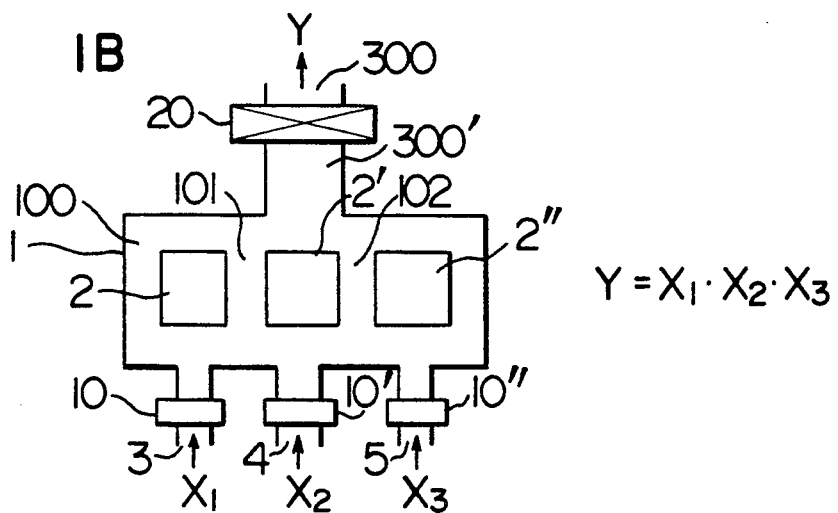

It is easy to expand this concept to multiple inputs, say, three inputs by, for instance, increasing the input terminals such as 3, 4, 5 shown in FIG. 1B. In the process, the arrangement, size, shape and height of the potential barriers 2, 2′, 2″ are designed to attain the desired output characteristics.

Figure 1C:
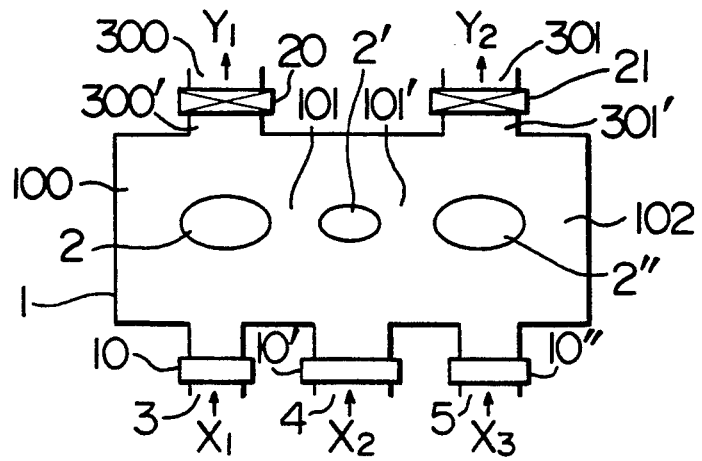

Expansion to multiple outputs is made possible, for example, by increasing input terminals to three of 3, 4, 5 as shown in FIG. 1C, and by providing two output gates 300′, 301′ for the outputs $Y_1$, $Y_2$. Also in FIG. 1C, the arrangement, size, shape and height of the potential barriers 2, 2′, 2″ are designed to obtain the desired output characteristics. If required, there may be provided sensing gates 20, 21 for sensing the electron waves proceeding toward the output wave guides 300, 301.

Figure 1D:
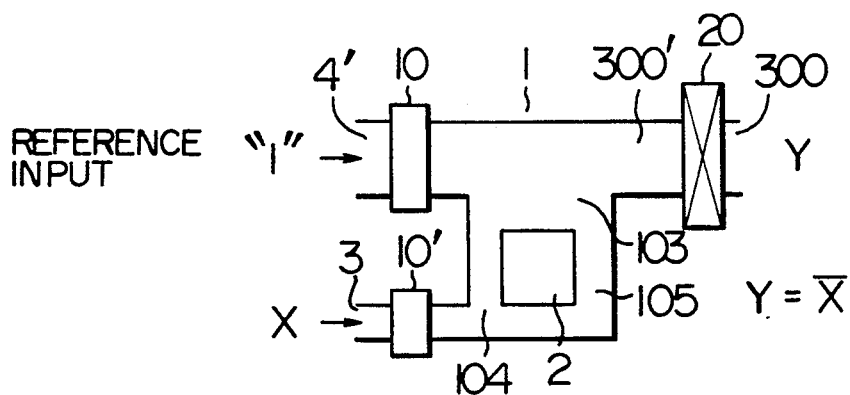

An inverter circuit is shown in FIG. 1D. A reference input "1" is kept flowing all the time through an electron wave guide 4′ and an input gate 10 in a stereoscopic three-dimensional region surrounded by the potential barrier 1. In the absence of an input electron wave X, the reference input electron wave "1" passes through the region 103 in the potential well and produces a "1" signal at the output gate Y. The electron wave X applied through the electron wave guide 3 and the input gate 10′ passes through the electron wave paths 104, 105, 103 separated by the potential barriers 2 and 1, and while causing an interference with the reference input electron wave at the output window 300′, proceeds to the output electron wave guide 300 through the sensing output gate 20 in the form of an output signal "0". In this manner the output signal Y becomes "1" when the input signal X is "0", and "0" when the input signal X is "1", thus making up an inverter.

The arrangement, size, shape and height of the potential barrier 2 and the electron wave paths 104, 105, 103 may be appropriately designed so that the input electron wave X and the reference input wave may offset each other with the phases thereof displaced by $\pi$ from each other.

Figure 1E:
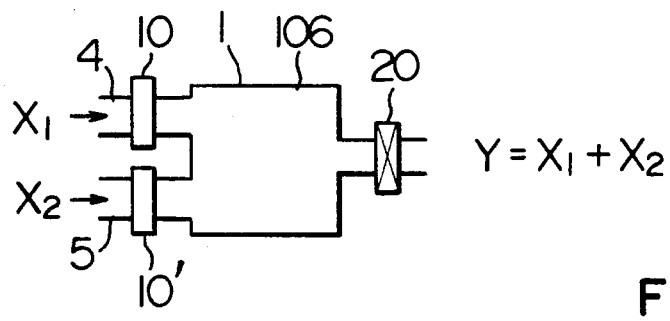

An OR circuit will be explained with reference to FIG. 1E. Electrons are introduced into a potential well through input gates 10, 10′ with the electron wave guides 4, 5 as an input in a stereoscopic three-dimensional region surrounded by the potential barrier 1. Since there is no potential barrier in the three-dimensional region surrounded by the potential barrier 1, electrons proceed to the output wave guide 300 through the sensing output gate 20 directly, if necessary, in the presence of either input signal $X_1$ of $X_2$. The shape of the three-dimensional region surrounded by the potential barrier 1 is designed in such a way as to synchronize and strengthen the electron waves produced at the output gate 20 through the electron wave path 106 when both the input signals $X_1$ and $X_2$ are applied. No output electron wave is produced of course in the absence of the input electron waves $X_1$ and $X_2$.

Figure 1F:
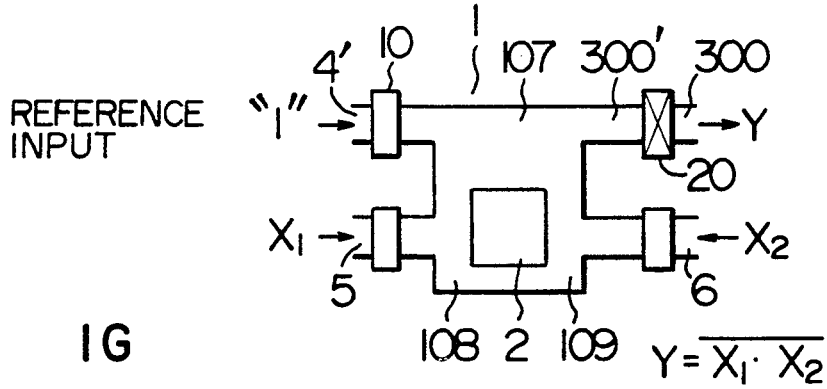

A NAND circuit will be explained with reference to FIG. 1F. A reference input "1" is kept flowing all the time through an electron wave guide 4′ and an input gate 10 in a stereoscopic three-dimensional region surrounded by the potential barrier 1. In the absence of the input electron waves $X_1$, $X_2$, the reference input electron wave "1" passes through the region 107 in the potential well and is produced as a "1" signal at the output gate Y. The arrangement, size, shape and height of the potential barrier well 1, the potential barrier 2 and the output electron wave paths 108, 109, 107 are designed in such a manner that only in response to the application of both the input electron waves $X_1$, $X_2$, the reference input electron wave and the output window 300′ interfere with each other, and an output signal "0" is applied through the sensing output gate 20 to the output electron waveguide 300. A NAND logic is formed if the system is designed in such a manner that upon application of one of the input signals $X_1$ and $X_2$, the reference input electron wave is intefered with the output window 300' thereby to prevent the output signal from disappearing.

Figure 1G:
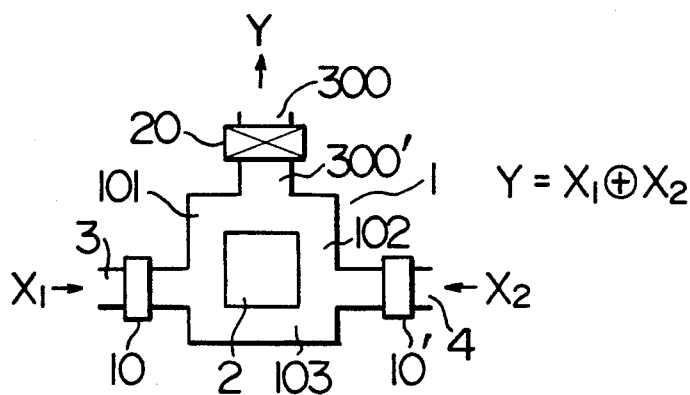

An exclusive OR circuit will be explained with reference to FIG. 1G. Electrons are introduced into the potential well through the input gates 10, 10' with the electron wave guides 3, 4 as inputs in a stereoscopic three-dimensional region surrounded by the potential barrier 1. The electrons are passed through the electron wave paths 101, 102, 103 separated by the potential barriers 2 and 1, and if necessary, applied through the sensing output gate 20 to the output electron wave guide 300. By appropriately designing the arrangement, size, shape and height of the three-dimensional region surrounded by the potential barriers 1 and 2, the electron waves produced at the output window 300' offset each other with the phases thereof displaced by $\pi$ in response to the application of input electron waves $X_1$, $X_2$. Also, in the absence of the input electron waves $X_1$, $X_2$, the output electron wave is of course not produced. The potential barrier 2 and the like are designed in such a manner that in the case where only one of the input electron waves $X_1$, $X_2$ is applied, the electron waves produced at the output window 300' intensify the phases thereof with each other by the potential barriers 2, 2'. In this way, if the presence of an input is represented by "1", the absence thereof by "0", the output intensity exceeding a predetermined value (threshold) by "1", and the output intensity not exceeding such a value by "0", then an exclusive OR circuit is configured by FIG. 1G. More specifically, upon application of only one of the signals $X_1$, $X_2$ as an input, the output "1" is produced. In this way, it is seen that the basic electron wave logic is realized by use of the interference effect taking advantage of the "route difference" of electrons in a three-dimensional region surrounded by the potential barrier 1.

Another method of controlling the phase of the electron wave will be explained with reference to FIGS. 2A and 2B on the basis of the meso-scopic circuit having the AND function described in FIG. 1A. First, as shown in FIG. 2A, atoms or atom mass (fine particles) (hereinafter referred to merely as "impurities") 500, 500' different from those of the mother crystal are intentionally arranged in the potential barriers 2, 2' within a stereoscopic three-dimensional region surrounded by the potential barrier 1. This makes it possible to add a potential in the electron wave paths 100, 101, 102 to control the interference and resonance of electron waves. Also, as shown in FIG. 2B, a thin metal wire 550 having a width substantially smaller than the electron paths is deposited on the potential barrier surrounding the electron wave path region (such as the portion designated by 101), and the potential distribution in the electron wave path may be designed to control the interference and resonance of the electron wave. The reason why a thin metal wire is used is to facilitate controlling the potential to an extent more than any other means. It is of course possible alternatively to use a conductive material such as a thin wire or a ring of a superconductor or to provide an external potential control terminal with equal effect.

Now, an example of the method of realizing an ordinary electron wave logic will be explained with reference to FIG. 2C. A number M of output gates Yi (i=1, 2, ... M) are provided against a number N of input gates Xi (i=1, 2, ... N) for a number N of input electron waves ki (i=1, 2, ... N) in a stereoscopic three-dimensional potential well 1 (N and M generally fail to coincide with each other). In this case, there generally may exist a number $2^N$ of input information and a number $2^M$ of output information. The arrangement, size, shape and height of the potential barriers 2-1 through 2-9 or the like, the impurities 500, 501, 502, 503 or the like, and the metal thin wire 104 or the like in the stereoscopic three-dimensional region surrounded by the potential barrier 1 are designed in accordance with the logic function to be desired. It is emphasized again that the size of the electron wave circuit having such a logic function as this is required to be meso-scopic.

Now, a design guide to an electron wave circuit according to the present invention will be explained below briefly.

For designing an electron wave circuit, it is necessary to obtain a standing wave solution of the Schrodinger equation for a single electron with each input gate supplied with electrons in a stereoscopic three-dimensional region surrounded by the potential barrier 1 under proper boundary conditions (it is assumed that the electron wave function is continuous with the differentiation along the normal also continuous in the boundary of the potential barrier where elastic scattering occurs) in view of the elastic scattering which occurs in the electron wave circuit as a principle. In designing an electron wave circuit in practical applications, it is necessary, strictly speaking, also to handle the inelastic scattering. This is possible by solving the expanded Schrodinger equation under the above-mentioned boundary conditions by use of a technique such as an optical potential method (See, for example, T. Usagawa Phys. Lett 73A (179), p. 193).

Figure 4A:
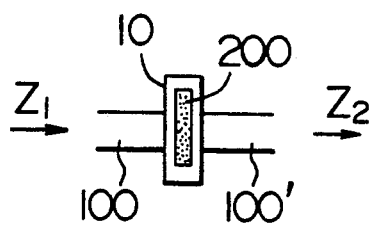
FIGS. 4A through 4C are schematic diagrams for explaining an example of configuration of an input gate of a quantum wave circuit according to the present invention.
Figure 4B:
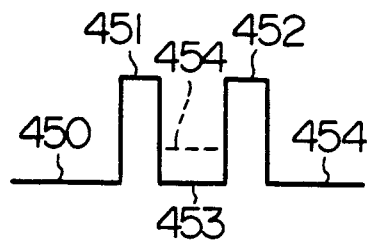
Figure 4C:
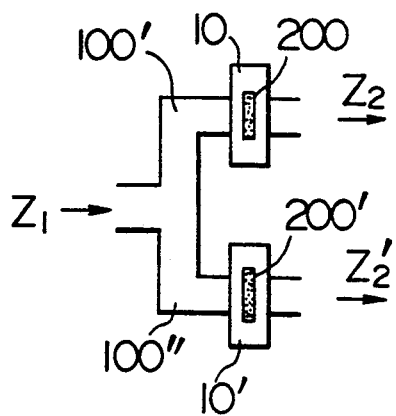

An electron input mechanism will be explained with reference to FIGS. 4A to 4C and 5A to 5C. In the case where it is desired to apply an electron wave of 15 a specific wave number $k_0$ to an input gate, such an electron wave with a wave number component of the incident electron wave $Z_1$ is selected by use of a sensing gate 10 as shown in FIG. 4A, for example. The sensing gate 10 may be provided with a control terminal 200 for wave number selection. Now, a specific sensing mechanism will be explained with reference to FIG. 4B showing an energy band of a conduction band in a quantum well structure using, for instance, a GaAs/Al$_x$Ga$_{1-x}$As hetero structure (GaAs 450/Al$_x$Ga$_{1-x}$As 451/GaAs 453/Al$_x$Ga$_{1-x}$As 452/GaAs 454). By use of a resonance tunnel structure, the electron wave of the desired wave number $k_0$ is designed to coincide selectively with the resonance order 454 in the well thereby forming a wave number filter. In this case, however, the sensing gate 10 may be either a voltage gate bridged between the ends of the quantum well or an injection gate for injecting electrons into a GaAs 450 to the extreme left of the quantum well. In order to assure synchronism, incident electrons may be divided into two paths 100' and 100" as shown in FIG. 4C.

Figure 5A:
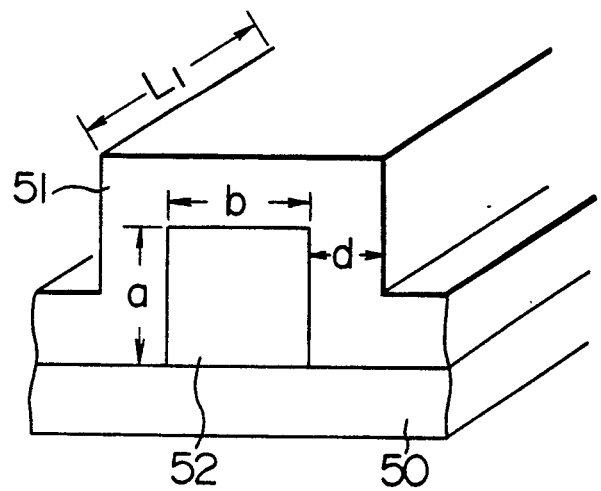
FIGS. 5A through 5C are schematic diagrams for explaining an example of configuration of a quantum wave guide of a quantum wave circuit according to the present invention.
Figure 5B:
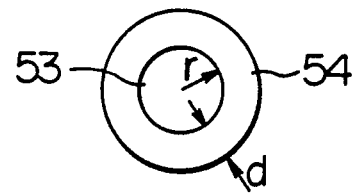
Figure 5C:
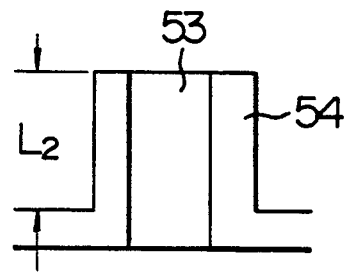

Now, the concept of an electron wave guide comprising a GaAs/Al$_x$Ga$_{1-x}$As will be explained with reference to FIGS. 5A to 5G. FIG. 5a is a perspective view of a GaAs wave guide 52 surrounded by the Al$_x$Ga$_{1-x}$As 50, 51. The GaAs region 52 high in potential energy acts as an electromagnetic wave guide for electrons and holes. This wave guide may be designed in substantially the same manner as before except for the fact that Maxwell's equation is used instead of Shrodinger's equation. Design parameters include the length a, b of each side of a shape (rectangle in the present case) of the section of the electron wave guide, the film thickness d of the Al$_x$Ga$_{1-x}$As 50, 51, the Al component x, and the impurities concentration in the semiconductor. An example of the cylindrical electron wave guide is shown in FIGS. 5B and 5C. FIG. 5B is a sectional view in radial direction. The Al$_x$Ga$_{1-x}$As having a film thickness of d is arranged around the GaAs 53 having a radius of r. A longitudinal sectional view of a waveguide is shown in FIG. 5C. In the present case, the length of the waveguide is L$_2$.

What is essential as a waveguide is to determine the film thickness and composition in such a manner that electrons or holes may not penetrate the AlGaAs 50, 51, 54.

In the quantum wave circuit according to the present invention described above, a memory of, say, 1 kilo-bits is formed in a meso-scopic size. Therefore, the access time $t_{AA}$ is determined by the motion of electrons within a meso-scopic distance and is in the order of psec ($10^{-12}$). The number of electrons entering the meso-scopic memory, which is at most the same as input electron waves, may be in the range from one to ten and several. The energy consumption caused by the inelastic scattering in the process of guiding electrons in this memory, is minimal since only elastic scattering occurs substantially in the meso-scopic circuit for its nature. The energy consumed while electron energy associated with the input and output of electrons and input of a reference electron wave is scattered is very small in principle. This is also the case with a meso-scopic logic in the gate scale of several thousands. According to the present invention, a memory or logic of 1T(tera)-bit ($10^{12}$) class is easily realized by integrating such meso-scopic memories or logics in the number of $10^8$ or so.

A quantum wave circuit will be described in more detail below with reference to embodiments.

EMBODIMENT 1

Figure 6A:
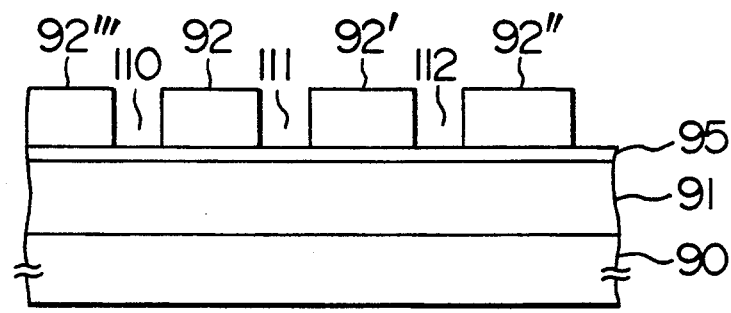
FIGS. 6A through 6C are diagrams showing a configuration for explaining still another embodiment of the quantum wave circuit according to the present invention.
Figure 6B:
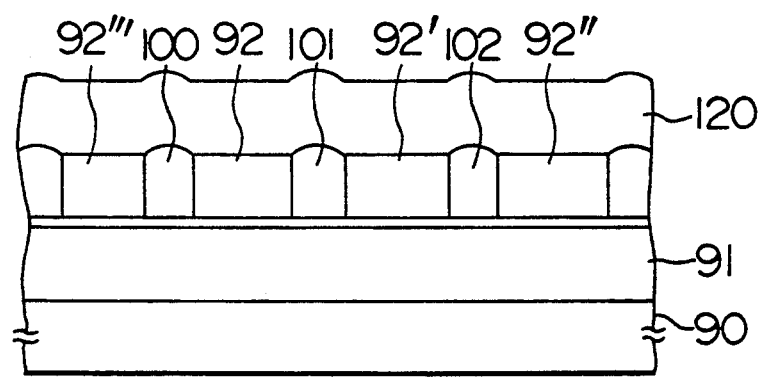
Figure 6C:
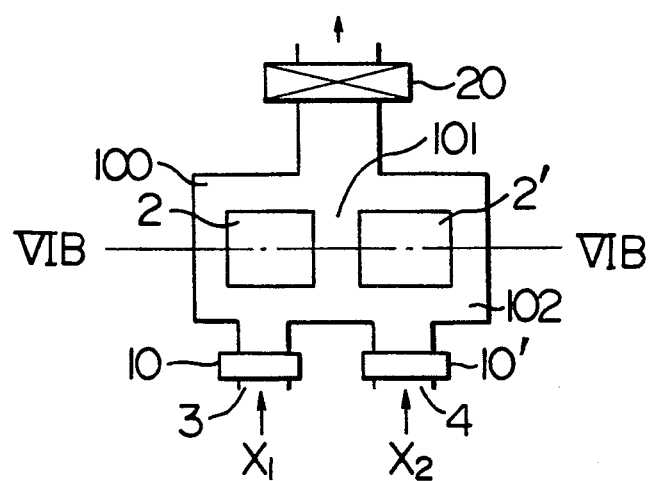

A quantum wave circuit as applied to an AND circuit according to the present invention will be explained below with reference to FIGS. 6A, 6B and 6C.

An undoped Al$_x$Ga$_{1-x}$As (x=0.3) 91 is grown in crystal (500 nm thick), an undoped GaAs 95 (1 nm thick), and an undoped Al$_x$Ga$_{1-x}$As (x=0.3) 92 (25 nm thick) on a semi-insulating GaAs substrate by the molecular beam epitaxy (MBE) technique. Next, the part of the undoped Al$_x$Ga$_{1-x}$As (c=0.3) 92 corresponding to the electron wave guides 110, 111, 112 are etched off by the electron beam (EB) lithography to form undoped Al$_x$Ga$_{1-x}$As (x=0.3) 92, 92', 92'', 92''' and the like. Further, as shown in FIG. 6B, the undoped GaAs 95 is regrown as buried at parts 100, 101, 102 and the like by MOCVD (organic metal thermal decomposition) technique to grow an undoped Al$_x$Ga$_{1-x}$As (x=0.3) 120 (500 nm thick). A sectional view taken in line VIB–VIB of an AND circuit (FIG. 6C) is shown in FIG. 6B. The input gates 10, 10' and the output gate 20 are formed by a method already explained. The electron wave guides 100, 101, 102 are selected at the width of 15 nm to 30 nm.

Although an AND circuit with electron wave guides surrounded by a potential barrier was explained above as an example, the path (route) for interference is not necessarily two-dimensional as according to the present embodiment. A three-dimensional electron interference may alternatively be utilized with the potential barriers 2, 2' surrounded stereoscopically by electron wave guides. In similar fashion, electron wave circuits shown in FIGS. 1B–1G and 2A–2C may be configured.

EMBODIMENT 2

Figure 7A:
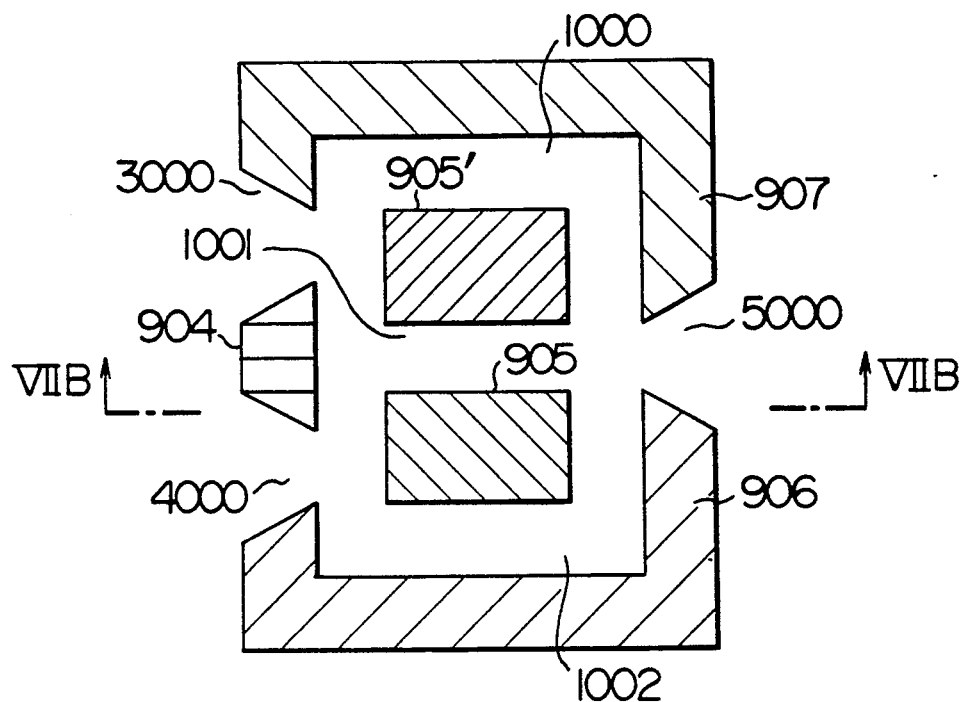
FIGS. 7A and 7B are diagrams showing a configuration for explaining a further embodiment of the quantum wave circuit according to the present invention.
Figure 7B:
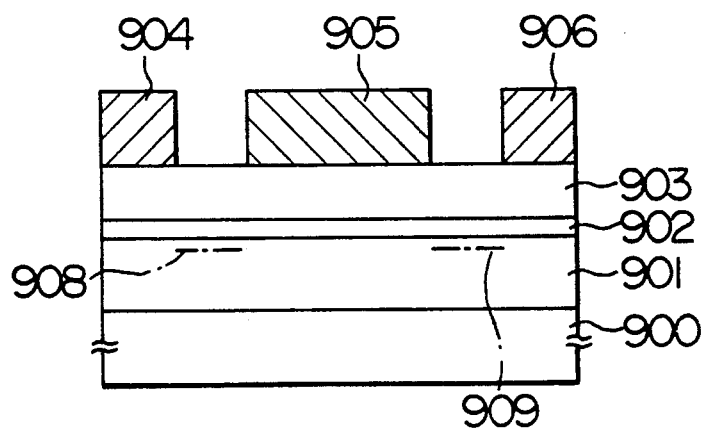

An example of AND circuit formed by use of 2DEG (Two-Dimensional Electron Gas) method will be explained with reference to FIGS. 7A and 7B. This embodiment concerns the interference effect of an electron route (path) controlled by a form potential. The two-dimensional electron gas (2DEG) formed in the hetero junction boundary of n-AlGaAs/undoped GaAs or the like has a meso-scopic length of several hundred to several thousand nm with regard to the motion along the direction parallel to the hetero junction boundary at least in a low electric field region under a low temperature (77K or 4K) environment (in which only elastic scattering occurs). If Schottky electrodes are arranged as designated by 904, 905, 905', 906 and 907 in FIG. 7A in the 2DEG boundary, the electrons applied through the input gates 3000, 4000 are produced at an output gate 5000 through electron paths 1000, 1001, 1002. A sectional view taken in line VIIB–VIIB is shown in FIG. 7B. An undoped GaAs 901 is formed (500 nm thick), an undoped Al$_x$Ga$_{1-x}$As (x=0.3) 902 (3 nm thick) and an n-type Al$_x$Ga$_{1-x}$As (x=0.3) 903 containing 2·10$^{18}$ cm$^{-3}$ of Si (40 nm thick) on a semi-insulating GaAs substrate 900. Schottky electrode metal 904, 905, 906 for controlling the 2DEG 908, 909 are formed by use of WSi. A plan view (FIG. 7A) of the AND circuit according to the present embodiment is identical to that shown in FIG. 1A. A meso-scopic circuit utilizing 2DEG corresponding to other logic circuits (FIGS. 1B–1G and 2A–2C) may also be formed by a similar method. The present embodiment using 2DEG is different from Embodiment 1 in that Embodiment 1 uses the interference effect of an electron wave guide free of electrons while an electron wave circuit using 2DEG according to Embodiment 2 takes advantage of the interference effect of electrons through a path where electrons are originally present. As a result, according to the present embodiment, a large electron wave guide may be formed, and the form potential may be controlled by applying a voltage to the gate electrodes 904, 905, 905', 906 and 907. Also, a single path is formed in the electron wave guides 1000, 1001, 1002 according to Pauli principle. Further, the 2DEG concentration may be controlled by applying a voltage to the gate electrodes. FIG. 7B shows a complete depletion in particular.

It will thus be understood from the foregoing description that in a quantum wave circuit according to the present invention, an interference path of electrons (or other carriers like holes) is realized as a desired logic or memory circuit by controlling the potential form in a region where only elastic scattering occurs, and therefore a system very high in integration and speed and low in power consumption is provided.

Although the invention has been described with reference to an electron or a hole device, it is to be appreciated that other semiconductor devices are applicable, including complementary devices, other carrier devices such as polariton devices, and the like.

The invention has been described with reference to the preferred embodiments. Obviously, modifications and alterations will occur to those of ordinary skill in the art upon reading and understanding the present specification. It is intended that the invention be construed as including all such alterations and modifications in so far as they come with the scope of the appended claims or the equivalent thereof.

We claim:

1. A quantum wave circuit comprising:
   an input gate supplied with carriers making up signals;
   an output gate providing an output for carriers;
   and a guide leading the carriers from the input gate to the output gate, wherein the guide includes a plurality of paths, one of which is selected for passing the carriers as determined by a quantum mechanical probability defined by a quantum interference effect between the quantum wave of the carriers and a potential structure of the guide.

2. A quantum wave circuit according to claim 1, wherein the carriers are at least of a type selected from a plurality of types of carriers including electrons and holes.

3. A quantum wave circuit according to claim 1, wherein an arithmetic operation is executed by detecting the intensity of the carriers produced at the output gate.

4. The circuit as set forth in claim 1, wherein the paths are connected so as to form a loop.

5. A quantum wave circuit comprising a plurality of unit circuits, each of said plurality of unit circuits comprises:
   an input gate supplied with carriers making up signals;
   an output gate providing an output for carriers; and
   a guide leading the carriers from the input gate to the output gate, wherein the guide provides a plurality of paths one of which is selected for passing the carriers as determined by a quantum mechanical probability defined by a quantum interference effect between the quantum wave of the carriers and a potential structure of the guide
   wherein the output gate of at least one predetermined unit circuit is connected to the input gate of at least one other unit circuit thereby connecting a plurality of unit circuits.

6. A quantum wave circuit comprising:
   a plurality of input gates, said input gates adapted to receive carriers;
   a plurality of carrier paths coupled to said plurality of input gates, comprising potential wells partitioned by potential barriers, and permitting passage of received carriers in the potential wells along the potential barriers; and
   an output gate coupled to at least one of said plurality of carrier paths, said output gate adapted to provide carriers as an output.

7. A quantum wave circuit according to claim 6, further comprising a thin metal wire, which has a width substantially smaller than said carrier paths, disposed on at least one of said potential barriers surrounding said potential wells.

8. A quantum wave circuit according to claim 6, further comprising another output gate coupled to at least one of said plurality of carrier paths, outputting the carriers.

9. A quantum wave circuit comprising:
   a plurality of input gates supplied with carriers making up signals;
   a plurality of output gates providing outputs for carriers; and
   a guide leading the carriers from the input gates to the output gates, wherein the guide includes a plurality of paths, one of which is selected for passing the carriers as determined by a quantum mechanical probability defined by a quantum interference effect between quantum waves of the carriers and potential structures of the guide.

10. A quantum wave circuit according to claim 9, wherein the carriers are at least of a type selected from a plurality of types of carriers including electrons and holes.

11. A quantum wave circuit according to claim 9, wherein an arithmetic operation is executed by detecting the intensity of the carriers produced at the output gates.

12. A quantum wave circuit according to claim 9, wherein the paths are connected so as to form a loop.

13. A quantum wave circuit comprising a plurality of unit circuits, each of said plurality of unit circuits comprises:
   a plurality of input gates supplied with carriers making up signals;
   a plurality of output gates providing outputs for carriers; and
   a guide leading the carriers from the input gates to the output gates, wherein the guide includes a plurality of paths, one of which is selected for passing the carriers as determined by a quantum mechanical probability defined by a quantum interference effect between quantum waves of the carriers and potential structures of the guide,
   wherein the output gates of at least one of the unit circuits are connected to the input gates of another unit circuit thereby connecting the plurality of unit circuits.

* * * * *

UNITED STATES PATENT AND TRADEMARK OFFICE
CERTIFICATE OF CORRECTION

PATENT NO. : 5,233,205
DATED : August 3, 1993
INVENTOR(S) : Toshiyuki Usagawa et al It is certified that error appears in the above-indentified patent and that said Letters Patent is hereby corrected as shown below:

| Column | Line | |
|---|---|---|
| 1 | 67 | Before "control" insert --a--. |
| 2 | 3 | Change "practically" to --in practice--. |
| 2 | 16 | After "memory" insert --which is--; after "integration" insert --by--. |
| 2 | 17 | After "magnitude" delete "higher". |
| 2 | 47 | Delete "respec-". |
| 2 | 48 | Delete "tively". |
| 3 | 5 | Change "largescale" to --large scale--. |
| 3 | 43 | After "potential" delete "well". |
| 3 | 56 | After "carriers" insert --is provided--; after "thereby" delete "to"; change "improve" to --improving--. |
| 3 | 57 | Delete "is provided". |

UNITED STATES PATENT AND TRADEMARK OFFICE
CERTIFICATE OF CORRECTION

PATENT NO. : 5,233,205
DATED : August 3, 1993
INVENTOR(S) : Toshiyuki Usagawa et al It is certified that error appears in the above-indentified patent and that said Letters Patent is hereby corrected as shown below:

| Column | Line | |
|---|---|---|
| 6 | 49 | Before "electron" delete "the". |
| 7 | 1 | Before "quantum" delete "the". |
| 7 | 22 | Change "be" to --been--. |
| 7 | 50 | Change "tion" to --tions--. |
| 8 | 41 | Change "$X^1$ of $X^2$" to --$X^1$ or $X^2$--. |
| 10 | 35 | After "of" delete "15". |
| 11 | 19 | Change "$(10^{-12})$" to --$(10^{12})$--. |
| 11 | 24 | After "memory" delete ","; after "minimal" insert --,--. |
| 11 | 25 | Change "for its nature" to --by reason of its inherent characteristics--. |
| 11 | 47 | After "by" delete "the". |
| 12 | 24 | Change "$2'10^{18}$" to --$2\times10^{18}$--. |

Signed and Sealed this

Twenty-sixth Day of July, 1994

Attest:

BRUCE LEHMAN

Attesting Officer     Commissioner of Patents and Trademarks